(12) United States Patent
Kondo et al.

(10) Patent No.: US 8,359,999 B2
(45) Date of Patent: Jan. 29, 2013

(54) FILM FORMING DEVICE

(75) Inventors: Yoshinari Kondo, Mitsuke (JP); Kentaro Suzuki, Mitsuke (JP); Eichi Matsumoto, Mitsuke (JP); Miyuki Tajima, Mitsuke (JP)

(73) Assignee: Tokki Corporation, Niigata (JP)

( * ) Notice: Subject to any disclaimer, the term of this patent is extended or adjusted under 35 U.S.C. 154(b) by 357 days.

(21) Appl. No.: 12/863,136

(22) PCT Filed: Dec. 24, 2008

(86) PCT No.: PCT/JP2008/073430
§ 371 (c)(1),
(2), (4) Date: Jul. 15, 2010

(87) PCT Pub. No.: WO2009/090839
PCT Pub. Date: Jul. 23, 2009

(65) Prior Publication Data
US 2011/0048323 A1 Mar. 3, 2011

(30) Foreign Application Priority Data
Jan. 16, 2008 (JP) .................. 2008-007106

(51) Int. Cl.
B05C 13/00 (2006.01)
B05C 13/02 (2006.01)
B05C 21/00 (2006.01)
B05C 11/11 (2006.01)
C23C 16/00 (2006.01)

(52) U.S. Cl. ........ 118/503; 118/500; 118/504; 118/505; 118/715; 118/720; 118/721

(58) Field of Classification Search .............. 118/500, 118/503, 504, 505, 715, 720, 721
See application file for complete search history.

(56) References Cited

U.S. PATENT DOCUMENTS

| 7,097,750 B2 * | 8/2006 | Kang et al. ............ 118/504 |
| 2002/0187265 A1 * | 12/2002 | Mori et al. ............ 118/720 |
| 2008/0233272 A1 * | 9/2008 | Ibe et al. ............ 118/50 |

FOREIGN PATENT DOCUMENTS

| JP | 11-158605 A | 6/1999 |
| JP | 2001-003155 A | 1/2001 |

(Continued)

OTHER PUBLICATIONS

International Preliminary Report on Patentability dated Aug. 19, 2010.

(Continued)

*Primary Examiner* — Dah-Wei Yuan
*Assistant Examiner* — Binu Thomas
(74) *Attorney, Agent, or Firm* — Sughrue Mion, PLLC

(57) ABSTRACT

There is provided a film-forming device capable of advantageously superimposing and securing a substrate, a weight member, and/or a magnetic body while maintaining the precisely aligned substrate and mask in a superimposed state. The film-forming device is provided with a film-forming mask 5 and film-forming means for forming a thin film on the substrate 6 on which the film-forming mask 5 has been superimposed. The film-forming device comprises an aligning mechanism for moving the film-forming mask 5 and the substrate 6 relative to one another so that the film-forming mask 5 and the substrate 6 are aligned; a first superimposing and securing mechanism for superimposing and securing the substrate 6 and the film-forming mask 5 aligned by the aligning mechanism; and a second superimposing and securing mechanism for superimposing and securing the substrate superimposed and secured to the film-forming mask 5 by the first superimposing and securing mechanism, and a magnetic body 14 for magnetically attracting to an obverse surface side of the substrate 6 the film-forming mask 5 or a weight member 8 in the form of a sheet for causing the substrate 6 to bend and causing the substrate 6 to be affixably superimposed on the film-forming mask 5 so that the film-forming mask 5 is affixably superimposed on the substrate 6, the weight member being disposed on a reverse surface of the substrate 6.

4 Claims, 10 Drawing Sheets

FOREIGN PATENT DOCUMENTS

| | | |
|---|---|---|
| JP | 2001-348664 A | 12/2001 |
| JP | 2005-174843 A | 6/2005 |
| JP | 2006-299358 A | 11/2006 |
| JP | 2007-046099 A1 | 2/2007 |
| JP | 2007-138256 A | 6/2007 |
| JP | 2007-224396 A | 9/2007 |
| WO | 2005/087969 A1 | 9/2005 |
| WO | WO 2007145402 A1 * | 12/2007 |

OTHER PUBLICATIONS

International Search Report for PCT/JP2008/073430, dated Mar. 24, 2009, 7 pages.

* cited by examiner

FILM FORMING DEVICE

TECHNICAL FIELD

The present invention relates to a film-forming device.

BACKGROUND ART

In recent years, what is known as a four-sided secured soft tension mask has been proposed as a film-forming mask composed of a mask body having a pattern of openings that admit film formation material to pass, and a holding frame for holding the mask body, as disclosed in, e.g., Patent Document 1. The four sides of the mask body 41 are enclosed by the frame 42, and the mask body 41 is held in place while very light tension or no tension is applied by the frame 42 from four sides, as shown in FIG. 1.

The four-sided secured soft tension mask is advantageous in being lightweight and having little temperature variation. Since temperature variation is low, pattern displacement is not liable to occur during deposition performed by a vapor deposition device, and the lightness of weight enables transportation-related costs to be reduced.

[Patent Document 1] Japanese Laid-open Patent Application No. 2007-138256

DISCLOSURE OF THE INVENTION

Problems that the Invention is to Solve

However, a problem is presented in that the four-sided secured soft tension mask described above has poor adhesion to the substrate, films formed by, e.g., vapor deposition cannot be formed in accordance with the pattern of openings of the mask body, and the film-forming pattern on the substrate becomes irregular.

There has also been proposed a configuration in which, for example, a mask body 51 fashioned in the form of strips is held in a holding frame 52 in a state in which tension is applied from two sides so to avoid bending, as shown in FIG. 2. However, in such a configuration, the center portion 53 of the mask body 51 warps under the tension, as shown in FIG. 3, and adhesion to the substrate remains poor, making it difficult to adequately form a film.

In addition, the film-forming mask and the substrate are ordinarily superimposed in an optimal superimposing position that has been precisely aligned by an alignment mechanism, and when a weight member in the form of a sheet for forcibly causing, e.g., a substrate to flex and a magnet for drawing the mask to the substrate surface are superimposed, it is possible that the carefully aligned substrate and film-forming mask will be brought out of alignment when the weight member and the like make contact with the substrate.

The present invention is designed to solve the problems described above, and provides a highly practical film-forming device in which only two opposing sides of the mask body are secured to holding parts of the holding frame in a state that makes it possible to have the mask body flex in a natural manner so that no nonuniformities will be caused by bending of the mask body; and in which the adhesion between a film-forming mask and a substrate are improved and a precise film-forming pattern can be readily formed without a reduction in processability and film-forming pattern accuracy by using a film-forming mask that has good adhesion to the substrate and that can advantageously form a film in accordance with a pattern of openings on the substrate with no blurring of the deposition pattern and without sacrificing the advantages of lightness of weight and low temperature variability, and by using a superimposing and securing mechanism that can advantageously superimpose and secure the substrate, the weight member, and/or a magnet body while reliably maintaining the aligned and superimposed state between the film-forming mask and the substrate.

Means of Solving the Problems

The main points of the product inspection are described below with reference to the drawings.

The present invention relates to a film-forming device provided with a film-forming mask 5 and film-forming means for forming a thin film in a desired pattern by depositing film-forming material via the film-forming mask 5 onto the surface of a substrate 6 on which the film-forming mask 5 has been superimposed, the film-forming device characterized by comprising an aligning mechanism for moving the film-forming mask 5 and the substrate 6 relative to one another so that the film-forming mask 5 and the substrate 6 are aligned; a first superimposing and securing mechanism for superimposing and securing the substrate 6 and the film-forming mask 5 aligned by the aligning mechanism; and a second superimposing and securing mechanism for superimposing and securing the substrate 6 superimposed and secured to the film-forming mask by the first superimposing and securing mechanism, and a magnetic body 14 for magnetically attracting to an obverse surface side of the substrate 6 the film-forming mask 5 or a weight member 8 in the form of a sheet for causing the substrate 6 to bend and causing the substrate 6 to be affixably superimposed on the film-forming mask 5 so that the film-forming mask 5 is affixably superimposed on the substrate 6, the weight member being disposed on the reverse surface side of the substrate 6, wherein the film-forming mask 5 includes a mask body 1 having a pattern of openings through which a film-forming material is allowed to pass, and a holding frame 2 for holding the mask body 1; the holding frame is provided with a pair of holding parts 4 for holding a pair of opposing side parts 3, respectively, among the four sides of the mask body 1, the pair of holding parts being arranged along the pair of side parts 3, respectively; the holding frame 2 configured so that the mask body 1 is held only by the pair of holding parts 4; the pair of side parts 3 is secured to the pair of holding parts 4 so that the mask body 1 bends under the weight thereof between the pair of side parts 3 held by the pair of holding parts 4, and the amount by which the mask body 1 bends varies in the direction in which the pair of side parts 3 oppose one another; and the first superimposing and securing mechanism or the second superimposing and securing mechanism is provided with a support body 13 having a support surface part for supporting the substrate 6 on which the film-forming mask 5 has been superimposed; and pressing parts 15a, 15b capable of rising and lowering in relation to the support surface part of the support body 13; the first superimposing and securing mechanism or the second superimposing configured so that the film-forming mask 5 and the substrate 6, or the substrate 6 and the weight member 8 or the magnetic body 14, are held by the pressing parts 15a, 15b and the support surface part of the support body 13, whereby the film-forming mask 5 and the substrate 6 are superimposed and secured, or the substrate 6 and the weight member 8 or the magnetic body 14 are superimposed and secured.

The present invention according to a second aspect relates to the film-forming device according to the first aspect, and is characterized in comprising a support mechanism for supporting another pair of side parts 12, which belong to the mask body 1 of the film-forming mask 5 and are not held by the holding parts 4 of the holding frame 2, so as to keep the side parts substantially horizontally when the film-forming mask 5 and the substrate 6 are aligned together.

The present invention according to a third aspect relates to the film-forming device according to the first or second aspect, and is characterized in comprising a weight member transporting mechanism for holding and transporting the weight member 8 in a substantially horizontal state, the weight member transporting mechanism having an electrostatic chucking mechanism capable of chucking the weight member 8, or having an interlocking body 17 capable of interlocking with an interlocking part 16 provided to the weight member 8.

Effect of the Invention

The present invention as configured above is accordingly a film-forming device of high commercial utility, making it possible to advantageously superimpose and secure a substrate, a weight member, and/or a magnetic body while maintaining a superimposed state of the precisely aligned substrate and mask.

BEST MODE FOR CARRYING OUT THE INVENTION

Figure 1:
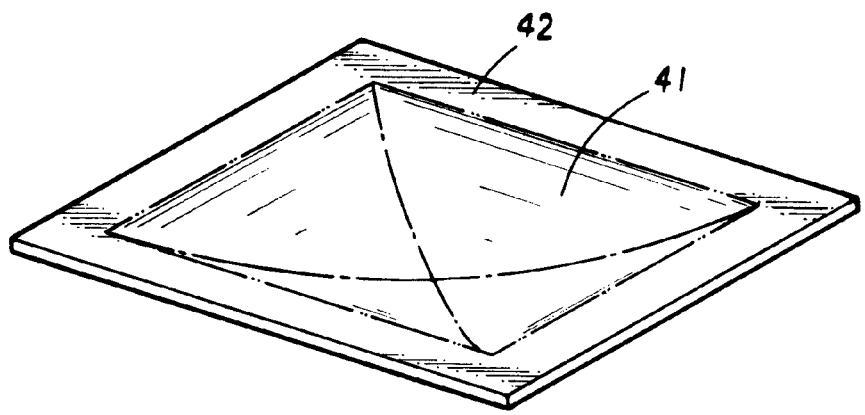
FIG. 1 is a schematic view of a conventional film-forming mask.
Figure 2:
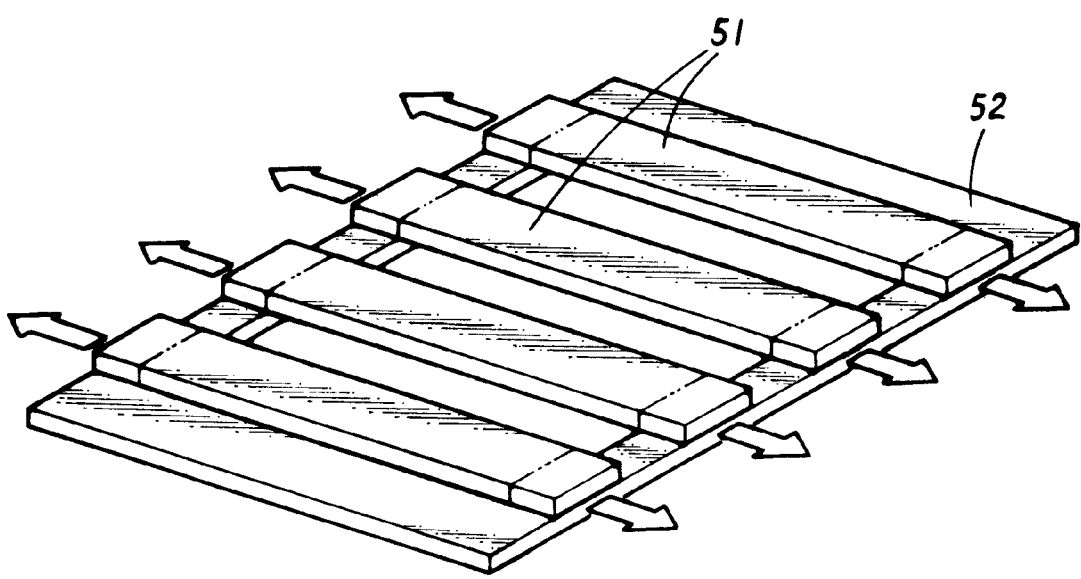
FIG. 2 is a schematic view of a conventional film-forming mask.
Figure 3:
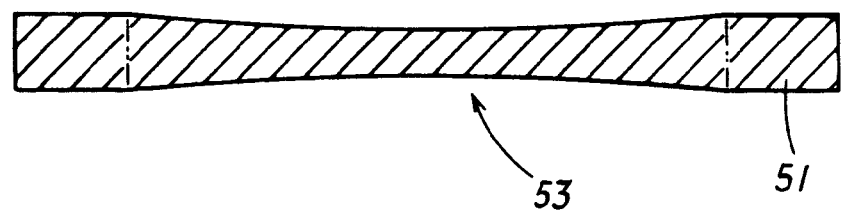
FIG. 3 is an enlarged schematic cross-sectional view of a main part of FIG. 2.

Preferred embodiments (the manner in which the present invention is implemented) of the present invention are briefly described below with reference to the diagrams while indicating the effects of the present invention.

A film-forming mask 5 and a substrate 6 aligned by an aligning mechanism are superimposed and secured by a first superimposing and securing mechanism. A second superimposing and securing mechanism is used to superimpose and secure a magnetic body 14 on the substrate 6 on which the film-forming mask 5 has been superimposed and secured by the first superimposing and securing mechanism (the reverse surface side of the substrate 6), the magnetic body 14 causing the film-forming mask 5, or a weight member 8 for affixably superimposing the substrate 6 on the film-forming mask 5, to be superimposed and secured on the substrate 6.

In other words, the film-forming mask 5, the substrate 6, and the weight member 8 and/or the magnetic body 14 are not superimposed and secured together, but rather there are provided a first superimposing and securing mechanism for superimposing and securing the film-forming mask 5 and the substrate 6 which required precise positioning by an aligning mechanism, and a second superimposing and securing mechanism for superimposing and securing on the substrate 6 the magnetic body 14 or the weight member 8 superimposed on the substrate 6 on which the film-forming mask 5 has been superimposed and secured. Such a division therefore makes it possible to superimpose and secure the film-forming mask 5 and the substrate 6 in advance when the weight member 8 or the magnetic body 14 is superimposed on the substrate 6, and the film-forming mask 5 and the substrate 6 can be reliably prevented from being brought out of alignment from an optimal superimposing position even if the weight member 8 or the magnetic body 14 makes contact with the substrate 6.

Therefore, when the weight member 8 and/or the magnetic body 14 is superimposed on the substrate 6 in the case that, e.g., the film-forming mask 5 described in the second aspect is used, the adhesion between the film-forming mask 5 and the substrate 6 can be further improved, and a precise film-forming pattern can be readily formed without a reduction in processability and film-forming pattern accuracy and without the film-forming mask 5 and the substrate 6 being brought out of alignment.

Even when used alone, each of the weight member 8 and the magnetic body 14 has the effect of improving adhesion between the substrate 6 and the film-forming mask 5, but adhesion is even more advantageously improved when both the weight member 8 and the magnetic body 14 are used. Specifically, when the weight member 8 is used, the substrate 6 is forcibly made to bend and to be affixably superimposed so as to conform to the film-forming mask 5. When the magnetic body 14 is used, the film-forming mask 5 can be attracted to and affixably superimposed on the obverse surface side of the substrate 6.

In the case that the film-forming mask 5 described in the second aspect is used, two side parts 3 are secured to two holding parts 4, respectively, and a mask body 1 held in the holding frame 2 bends under its own weight. Therefore, for example, a substrate 6 (and a magnet or the like) is layered thereon in order to carry out film formation, whereupon the mask body 1 follows the bending of the substrate 6 and the two adhere to each other with good adhesion.

For example, since there is no tension (or very little tension) applied to the four-sided secured soft tension mask, the mask is expected to follow the bending of the substrate and bend and curve to form good adhesion. However, the bending distance in the longitudinal and lateral directions changes when the four sides are secured, and bending in the two directions creates interference that produces nonuniformity in the bending of the mask body. The mask body warps, and good adhesion cannot be obtained because the warping produces complications.

In relation to this point, the film-forming mask 5 of the second aspect has a configuration in which a pair of opposing side parts 3 (two sides) is secured to a pair of holding parts 4.

The mask body 1 bends under its own weight between the pair of side parts 3, and the bending distance changes only in the opposing direction (a single direction) of the pair of side parts 3, whereby bending interference does not occur and nonuniformity is less likely to occur. Therefore, warping of the mask body 1 is simplified and reduced, making it possible for the mask to adequately follow the bending of the substrate 6 and adhere fast thereto.

In other words, since more natural bending can be achieved, the mask body 1 can flexibly follow the bending of the substrate 6 and adhere to the substrate 6 even when the substrate 6 is large and bends dramatically. Therefore, when the substrate 6 or the like is laid in place and a film is formed, good adhesion is formed with the substrate 6 whereby the film can be formed in accordance with the pattern of openings without the film formation pattern being disrupted on the substrate 6.

The strength required in the holding parts 4 can be kept lower than when a certain degree of tension is needed to prevent the mask body 1 from bending, and the holding frame 2 can be made thinner and more lightweight by a commensurate amount. Therefore, transport and other tasks are facilitated and processability is equivalently improved.

In particular, as the size of the mask (substrate) increases, adhesion declines as a result of the warping of the mask body 1, and the holding frame 2 becomes thicker and heavier. However, in accordance with the present invention, thickness and weight are reduced and good adhesion with the substrate can be achieved even when a large mask is used.

In a case where the first superimposing and securing mechanism or the second superimposing and securing mechanism is constituted so that the film-forming mask 5 and the substrate 6 are superimposed and secured, or the substrate 6 and the weight member 8 and/or the magnetic body 14 are superimposed and secured, the superimposing and securing can be performed without there being an inflection point of the bending of the film-forming mask 5, and the mask body 1 can be made to bend more naturally. This is achieved, e.g., by providing a support body 13 having a support surface part for supporting the substrate 6 on which the film-forming mask 5 is superimposed, and pressing parts 15a, 15b that are capable of rising and lowering in relation to the support surface part of the support body 13; and by holding the film-forming mask 5 and the substrate 6, or the substrate 6 and the weight member 8 and/or the magnetic body 14 using the pressing parts 15a, 15b and the support surface part of the support body 13.

In other words, the pressing parts 15a, 15b capable of rising and lowering in relation to the support surface part are turned down slightly in the direction of the angle of depression rather than the substrate surface direction, the lower surface of the pressing parts 15a, 15b that faces the substrate 6 is made to be slightly downwardly inclined facing inward (the distal end sides of the pressing parts 15a, 15b), and a portion (distal end part) of the pressing parts 15a, 15b protruding to the substrate-most side are pressed firmly against the end portions of the substrate 6 to hold and secure the film-forming mask 5 and the substrate 6. Therefore, in comparison with the case in which (the lower surfaces of the pressing surfaces of) the pressing parts are lowered in a state horizontal to the substrate surface direction and the lower surfaces of the pressing parts are pressed horizontal in over a wide range to the end parts of the substrate, the film-forming mask 5 and the substrate 6 can be superimposed and secured so as to conform to the curved shape of the bending of the mask body 1 as far as the end portions of the film-forming mask 5.

For example, in the case that a support mechanism is provided for supporting another pair of side parts 12, which belong to the mask body 1 of the film-forming mask 5 and are not held by the holding parts 4 of the holding frame 2, so as to keep the side parts substantially horizontally when the film-forming mask 5 and the substrate 6 are aligned together, the bending of the mask body 1 can be eliminated and more precise positioning is made possible when the film-forming mask 5 and the substrate 6 are aligned by an aligning mechanism.

For example, a tungsten sheet or another weight member 8 that is awkward to transport can be readily transported in the case that a weight member transporting mechanism is provided having an electrostatic chucking mechanism capable of chucking the weight member 8, or having an interlocking body 17 capable of interlocking with an interlocking part 16 formed on the weight member 8, and that holds and transports the weight member 8 in a substantially horizontal state.

EXAMPLES

Specific examples of the present invention are described below with reference to FIGS. 4 to 14.

The present example is a film-forming device provided with a film-forming mask 5 and film-forming means for forming a thin film in a desired pattern by depositing film-forming material via the film-forming mask 5 onto the surface of a substrate 6 on which the film-forming mask 5 has been superimposed. The film-forming device comprises an aligning mechanism for moving the film-forming mask 5 and the substrate 6 in a relative fashion so that the film-forming mask 5 and the substrate 6 are aligned; a first superimposing and securing mechanism for superimposing and securing the substrate 6 and the film-forming mask 5 aligned by the aligning mechanism; and a second superimposing and securing mechanism for superimposing and securing the substrate 6 superimposed and secured to the film-forming mask 5 by the first superimposing and securing mechanism, and a magnetic body 14 for magnetically attracting to an obverse surface side of the substrate 6 the film-forming mask 5 or a weight member 8 in the form of a sheet for causing the substrate 6 to bend and causing the substrate 6 to be affixably superimposed on the film-forming mask 5 so that the film-forming mask 5 is affixably superimposed on the substrate 6, the weight member being disposed on the reverse surface side of the substrate 6.

Figure 4:
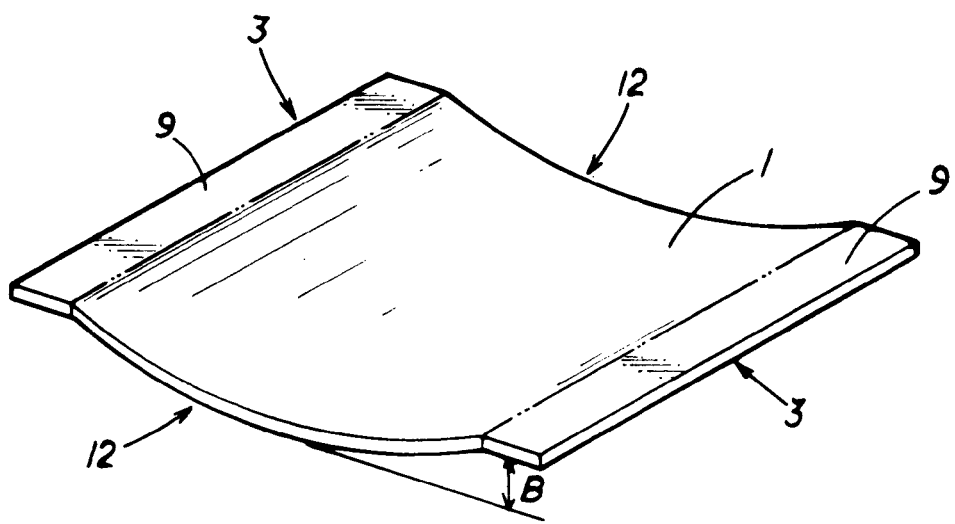
FIG. 4 is a schematic perspective view of the mask body of the film-forming mask of the present example.
Figure 5:
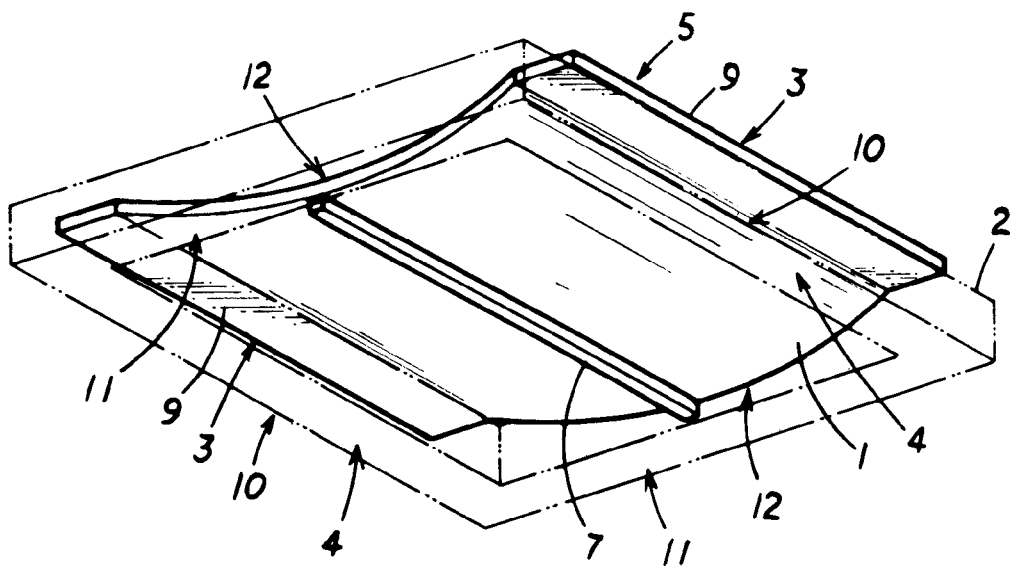
FIG. 5 is a schematic perspective view of the film-forming mask of the present example.
Figure 6:
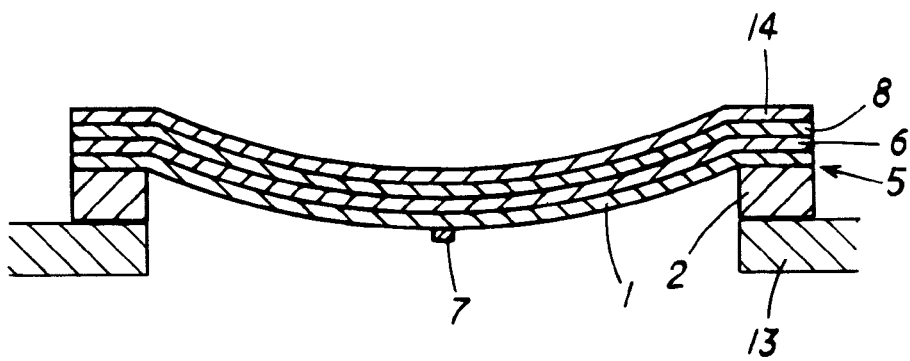
FIG. 6 is a schematic cross-sectional view showing the usage state of the film-forming mask of the present example.
Figure 7:
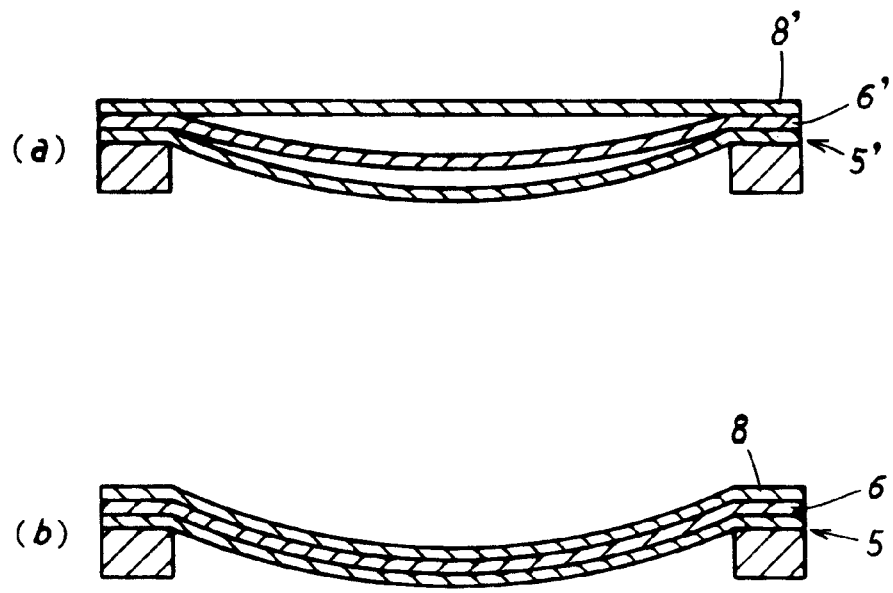
FIG. 7 is a schematic cross-sectional view for illustrating the difference in the layering state due to differences in the weight member of the film-forming mask of the present example.

The film-forming mask 5 used in the present example is composed of the mask body 1 having a pattern of openings through which a film-forming material is allowed to pass, and a holding frame 2 for holding the mask body 1, as shown in FIGS. 4 and 5, and is a film-forming mask in which the substrate 6 is layered by depositing the film-forming material via the pattern of openings. The holding frame 2 is provided with a pair of holding parts 4 for holding a pair of side parts 3, respectively, and the pair of holding parts 4 is arranged along the pair of opposing side parts 3 on the four sides of the mask body 1. The holding frame 2 is configured so that the mask body 1 is held only by the pair of holding parts 4. The pair of side parts 3 is secured to the pair of holding parts 4 so that the mask body 1 bends under its own weight between the pair of side parts 3 held by the pair of holding parts 4 and an amount of the bending varies in the opposing direction of the pair of side parts 3.

The mask body 1 is a common quadrangular metal mask made of Invar or another metallic material. The mask body 1 has a film-forming region and a non-film-forming region. The film-forming region is formed from a pattern of openings (not shown) and a frame portion other than the pattern of openings, and is arranged in the region through which the film formation material passes inside the film formation device. The non-film-forming region is provided on the outer side (external periphery) of the film-forming region.

Specifically, edge parts 9 that serve as the non-film-forming regions are provided to the left and right of the film-forming region, and the edge parts 9 are secured to the pair of holding parts 4 of the holding frame 2. The edge parts 9 may be provided in continuous fashion to the long or short sides of the film-forming region of the mask body 1.

The holding frame 2 is a frame body composed of Invar or another metallic material. In the present example, a pair of opposing side parts 10 that face the frame body is provided to the pair of holding parts 4. A pair of opposing side parts 11 other than the holding parts is arranged so as to not be in contact with another pair of side parts 12 (not held by the holding parts 4) of the mask body 1. The opposing side parts 10 and the opposing side parts 11 are provided in continuous fashion by way of corner sections.

The holding frame 2 is configured so that the aperture potion is larger than at least the film-forming region of the mask body 1 so as avoid overlapping the film-forming region of the mask body 1, and is also configured so that the edge parts 9 of the mask body 1 are secured to the pair of opposing side parts 10 serving as the pair of holding parts 4.

In the present example, the pair of side parts 3 of the mask body 1 is secured to the pair of holding parts 4 of the holding frame 2 so that tension is not applied to the mask body 1, and the mask body 1 bends in an unassisted manner under its own weight.

Specifically, one side of the left and right edge parts 9 is secured to one of the holding parts 4 based on the natural maximum bending distance B in a state in which the mask body 1 is substantially parallel to but not secured to the holding parts 4. The securing position on the other side is suitably adjusted and set with the other edge part secured to the other holding part 4, so that the securing position on the other side is not too near the first securing position, which would result in a forcibly recessed curve, nor too far, which would result in tension (i.e., so that there is no warping in the center portion).

The pair of side parts 3 (edge parts 9) and the holding parts 4 (opposing side parts 10) of the mask body 1 are securely bonded using an adhesive.

Specifically, the pair of opposing side parts 10 of the frame body are in contact with the entire length of the edge parts 9 of the mask body 1, and the lower surface of the edge parts 9 of the mask body 1 and the upper surface of the opposing side parts 10 of the frame body are secured in a substantially uniform manner by the adhesive across substantially the entire region in the lengthwise direction.

The lower surface of the edge parts 9 and the upper surface of the pair of opposing side parts 10 may be bonded over the entire surface or only on a portion of the surface. In the present example, the edge parts 9 and the pair of holding parts 4 are bonded in a substantially uniform manner across substantially the entire region in the lengthwise direction, but the surfaces may be bonded at predetermined intervals (numerous bonding portions may be provided in intervals). Although an adhesive is used for bonding, no limitation is imposed thereby; the pair of side parts 3 of the mask body 1 may be welded or otherwise secured to the holding parts 4 of the mask body 1.

Since the pair of side parts 3 are secured to the pair of holding parts 4 so that tension (tensile force and pressing force) is not applied to the mask body 1, i.e., in a state in which no tension is present, the mask body 1 bends in an unassisted manner in a curved arcuate shape under its own weight between the pair of side parts 3 (edge parts 9), and the bending distance varies in the opposing direction of the pair of side parts 3. Therefore, in the present example, the position equidistant from the pair of side parts 3 becomes the lowest bending point position, and the maximum bending distance is increased.

The bending distance B is shown in an exaggerated manner for illustrative purpose in the drawings, but the distance is very small in reality and is ordinarily about several ten to several hundred microns for a mask body 1 having a thickness of several millimeters. The thickness of the holding frame 2 is also shown in an exaggerated manner in accordance with the bending distance B, but the thickness is actually about several millimeters.

In the present example, a rod 7 substantially parallel to the pair of side parts 3 secured to the pair of holding parts 4 is disposed on the obverse surface side of the mask body 1, which is the side opposite from the reverse surface side for adhering to substrate surface, so as to correct the bending of the mask body 1.

Specifically, the rod 7 is made of Invar or another metal material in the same manner as the holding frame 2, and a single rod is disposed in the lowest bending position of the mask body 1 (the position at the maximum bending distance).

This is because the bending of the mask body 1 becomes nonuniform in the direction parallel to the edge parts 9 of the mask body 1, and the nonuniformity of the bending is corrected by using a weight member to pull on the portions in which the bending distance is small in a range that does not interfere with natural bending. The rod 7 further improves adhesiveness between the mask body 1 and the surface of the substrate. In other words, the configuration of the present example is designed so that the bending distance varies only in the opposing direction of the pair of side parts 3, and the bending distance does not vary in the parallel direction.

In the present example, a single rod 7 is disposed at the lowest position of bending of the mask body 1, but the lowest position is not given by way of limitation; the rod may be disposed in another location or in a plurality of locations. Also, the bending shape of the mask body 1 made by the rod 7 is not limited to a curved arcuate shape; the deformation may be a waveform or another shape. The rod 7 may be provided in the opposing direction of the pair of side parts 3 secured to the pair of holding parts 4. Furthermore, in the example described above, the rod 7 is provided as a specific example of the bend-rectifying body, but no limitation is imposed thereby; a plate shape or a mesh shape may be used. However, the bend-rectifying body must be provided to the frame portion in a manner that avoids blocking at least the pattern of openings and avoids interference with film formation.

In the present example, the mask body 1 is secured to the pair of holding parts 4 without the application of tension, but a small amount of tension may be applied (a so-called soft tension mask may be used).

In the present example, the film-forming mask is used for forming a film on a glass substrate 6 by placing (merely supporting or by securing using a suitable securing member) the (holding frame 2 of the) film-forming mask 5 having the configuration described above on a mask holder as the support body 13 disposed inside the film-forming chamber of the film-forming device, layering the glass substrate 6 on the film-forming mask 5 to superimpose and secure the two, layering a flexible weight member 8 in the form of a sheet on the glass substrate 6, causing the film-forming mask 5 to be affixably superimposed on the substrate surface by using the weight member 8 to forcibly bend the glass substrate 6, additionally layering on the weight member 8 the magnetic body 14 that is capable of magnetically attracting and affixing the mask body 1 to the substrate surface side, causing the film-forming mask and the glass substrate 6 to furthermore be affixably superimposed using the magnet 14 (see FIG. 6), superimposing and securing the film-forming mask 5 and the substrate 6 as well as the weight member 8 and the magnetic body 14, and spraying a film-forming material from below using vapor deposition, CVD, sputtering, or other film formation means to thereby form a film on the glass substrate.

The present example is provided with a loading chamber, a removal chamber, a preprocessing chamber, a film-forming chamber, a mask-stocking chamber, a mask-cleaning chamber, and a plurality of other types of preprocessing chambers, as well as a transport chamber capable of transporting a substrate or a mask to the preprocessing chambers. The support body 13 may be configured so as to support the entire lower surface of the holding frame 2, but is configured in the present example so as to support only the lower surface of the holding parts 4 for securing the pair of side parts 3.

Each part will be described in detail.

The first superimposing and securing mechanism and the second superimposing and securing mechanism are composed of a support body 13 having a support surface part for supporting the substrate 6 on which the film-forming mask 5 has been superimposed, and pressing parts 15a, 15b provided to the support body 13 so as to be capable of rising and lowering in relation to the support surface part; and are configured so that the film-forming mask 5 and the substrate 6, or the substrate 6 and the weight member 8 or the magnetic body 14 are held in place by the pressing parts 15a, 15b and the support surface part of the support body 13, whereby the film-forming mask 5 and the substrate 6 are superimposed and secured, or the substrate 6 and the weight member 8 or the magnetic body 14 are superimposed and secured.

Specifically, the pressing part 15a of the first superimposing and securing mechanism and the pressing part 15b of the second superimposing and securing mechanism are serially disposed so as to be capable of rotating to a raised or lowered position via a hinge part (not shown) on a base part 18 disposed upright on the support body 13. The pressing parts 15a, 15b are configured to be capable of being brought upright so that an angle of 90° or more can be achieved relative to the surface direction of the film-forming mask supported by the support surface part.

The pressing parts 15a, 15b of the first superimposing and securing mechanism and the second superimposing and securing mechanism are configured so that, when they are in a turned-up state, they are upright in a substantially parallel manner with respect to the base part 18 (an angle of elevation of 90°, or an angle of slightly greater than 90°), so that the substrate 6 is layered on the film-forming mask 5 secured or supported by the support body 13, and so that the weight member 8 and/or the magnetic body 14 can be layered on the substrate 6; and, when they are in a turned-down state, it is possible for the support body 13 and pressing parts 15a, 15b to be used to hold the film-forming mask 5 and the substrate 6, or the film-forming mask 5 and the substrate 6 as well as the weight member 8 and the magnetic body 14, and to superimpose and secure the two together.

Specifically, the pressing parts 15a, 15b are configured so as to be capable of being turned down slightly in the direction of the angle of depression rather than being parallel to the substrate surface direction, i.e., the pressing parts 15a, 15b are configured so as to be capable of being set in a state in which the lower surface of the pressing parts 15a, 15b that faces the substrate 6 is made to be slightly downwardly inclined facing inward (the distal end sides of the pressing parts 15a, 15b), and are configured so that, e.g., the film-forming mask 5 and the substrate 6 are held and secured by the distal end portions of the pressing parts 15a, 15b protruding to the substrate-most side being firmly pressed against the end portions of the substrate 6 or the like (the same applies to the weight member 8 and the magnetic body 14). In other words, the position of the connecting part (hinge part) between the base part 18 and the pressing part 15a of the first superimposing and securing mechanism is set in a position higher than at least the superimposed height of the film-forming mask 5 and the substrate 6 on the support body 13, and the position of the connecting part (hinge part) between the base part 18 and the pressing part 15b of the second superimposing and securing mechanism is set in a position higher than at least the superimposed height of the film-forming mask 5, the substrate 6, the weight member 8, and the magnetic body 14 on the support body 13.

Therefore, in comparison with the case in which (the lower surfaces of the pressing surfaces of) the pressing parts are lowered in a state horizontal to the substrate surface direction and the lower surfaces of the pressing parts are pressed horizontal in over a wide range to the end parts of the substrate, the film-forming mask 5 and the substrate 6, or the like can be superimposed and secured so as to conform to the curved shape of the bending of the mask body 1 as far as the end portions of the film-forming mask 5 or the like. In other words, when the support of the other pair of side parts 12 is released by a later-described support mechanism and the mask body 1 attempts bend in a natural fashion, the end parts (the portions near the outside end parts from the positions pressed by the distal ends of the pressing parts 15a, 15b) of the film-forming mask 5 and the like can curve slightly upward along the inclined lower surfaces of the pressing parts 15a, 15b. Therefore, the superimposing and securing can be carried out so that bending inflection points do not occur in the film-forming mask 5, and the mask body 1 can be made to bend more naturally.

In the present example, the pressing part 15a of the first superimposing and securing mechanism and the pressing part 15b of the second superimposing and securing mechanism have substantially the same thickness so that the inner and outer surfaces are substantially uniform in the upright state, and the pressing part 15a is a plate body having quadrangular shape as viewed from above, two of which being provided to each of the support bodies 13 (left and right support bodies 13). The pressing part 15b is an M-shaped plate body as viewed from above having a notched part 19 into which the pressing part 15a can be inserted. The upward-turning actions of the pressing parts 15a, 15b do not interfere with each other, and when the two are in an upright state, the pressing part 15a being aligned in the notched part 19 of the pressing part 15b so that the configuration saves as much space as possible.

The holding locations of the support body 13 and the pressing parts 15a, 15b are positions on an outward side of the pair of side parts on the side on which the holding parts 4 to which the mask body 1 is secured are provided. In other words, the other pair of side parts to which the mask body 1 is not secured is unattached (during film formation).

The present example is provided with a support mechanism for supporting another pair of side parts 12, which belong to the mask body 1 of the film-forming mask 5 and are not held by the holding parts 4 of the holding frame 2, so as to keep the side parts substantially horizontally when the film-forming mask 5 and the substrate 6 are aligned together.

In other words, there are cases in which precise positioning is not possible when positioning is carried out by viewing a positioning alignment mark using a camera 20 for cases in which the bending amount between the substrate 6 and the film-forming mask 5 is different because bending of the mask body 1 has occurred when the film-forming mask 5 and the substrate 6 are aligned. Therefore, the other pair of side parts 12, which belong to the mask body 1 and are not held by the holding parts 4, is kept substantially horizontal by the support mechanism when aligning work is carried out, and the configuration improves on the drawbacks described above so that aligning can be carried out in a satisfactory manner.

Specifically, the support mechanism is composed of a pair of support bodies 21 advanceably and retractably provided in the vertical direction. The support bodies 21 are made to advance upward to support the pair of side parts 12, respectively, when the alignment task is carried out, and are made to retract downward after the alignment task, and the superimposing and securing task has ended (i.e., retracted to a position that does not affect film formation during film formation).

The weight member 8 is preferably a flexible member having a certain amount of weight. Specifically, a tungsten sheet composed of tungsten and an elastomer is used. If a tungsten sheet is used, the tungsten sheet causes the substrate 6 to curve together with the curvature of the tungsten sheet and press against the mask body 1 to form good adhesion with the mask body 1 (see FIG. 7(b)).

If a weight member 8' composed of, e.g., aluminum, glass, or another hard substance is used, the weight member will not adequately bend, as shown in FIG. 7(a), and the substrate 6' cannot be made to bend, so that the adhesiveness between the substrate 6' and the film-forming mask 5' will be inadequate. The weight member 8 is not limited to being a tungsten sheet; it is also possible to use fluororubber or silicon sheet.

The weight member 8 can be readily transported when a weight member transporting mechanism is provided for holding and transporting the weight member 8 in a substantially horizontal state, where the weight member transporting mechanism has an electrostatic chucking mechanism capable of chucking the weight member 8, or has an interlocking body 17 capable of interlocking with an interlocking part 16 provided to the weight member 8.

Figure 8:
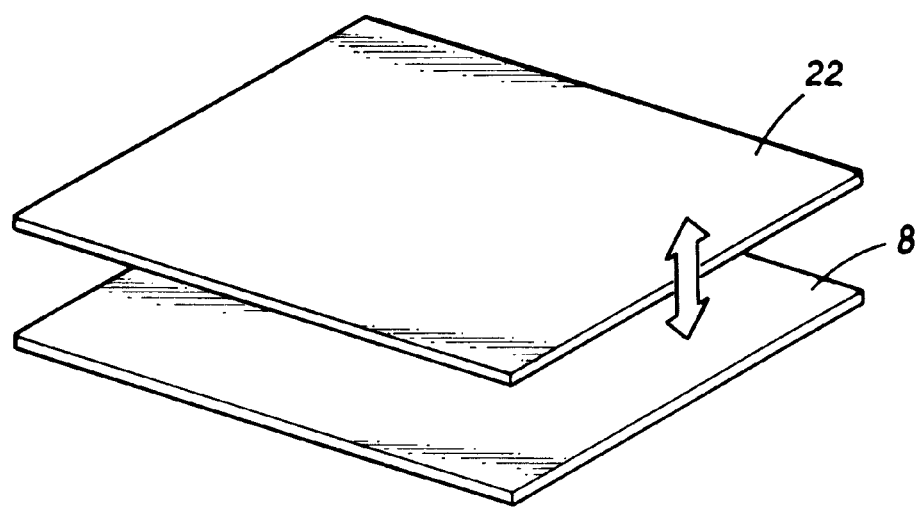
FIG. 8 is a schematic perspective view of the weight member transporting mechanism.
Figure 9:
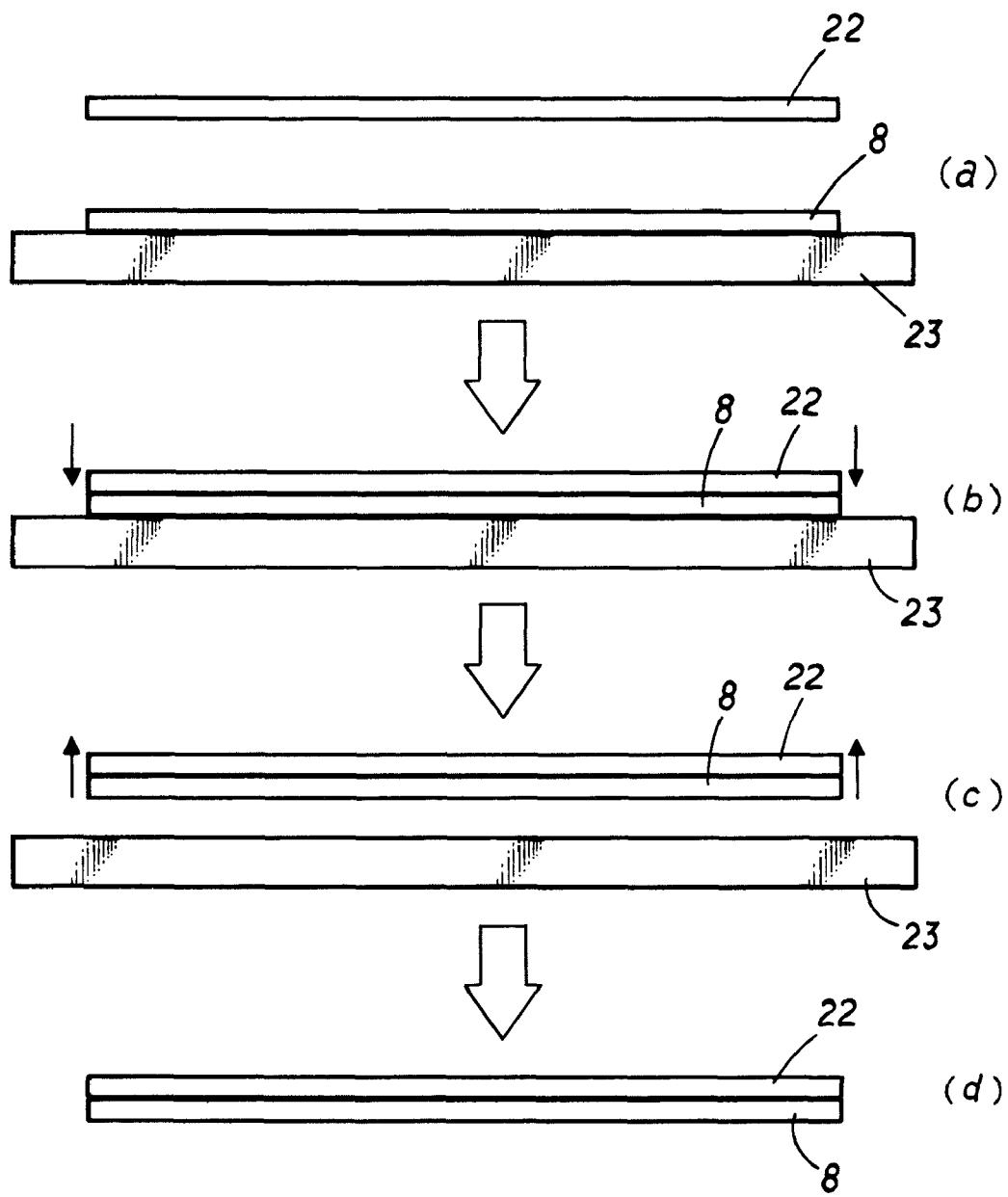
FIG. 9 is a schematic cross-sectional view for illustrating the usage sequence of the weight member transporting mechanism.

In the specific case that an electrostatic chucking mechanism is provided for electrostatically chucking the weight member 8 using an electrostatic chucking body 22 having substantially the same or greater surface area as the weight member 8, as shown in FIG. 8, the weight member 8 is transported (FIG. 9(a)) from another chamber into the film-forming chamber using a robot hand 23, the electrostatic chucking body 22, as shown in FIG. 9, is lowered in an OFF state onto the weight member 8 (FIG. 9(b)), electrostatic chucking is switched on and the weight member 8 is chucked and elevated using the electrostatic chucking body 22 (FIG. 9(c)), and the weight member 8 is transported by moving the electrostatic chucking body 22 (FIG. 9(d)).

Figure 10:
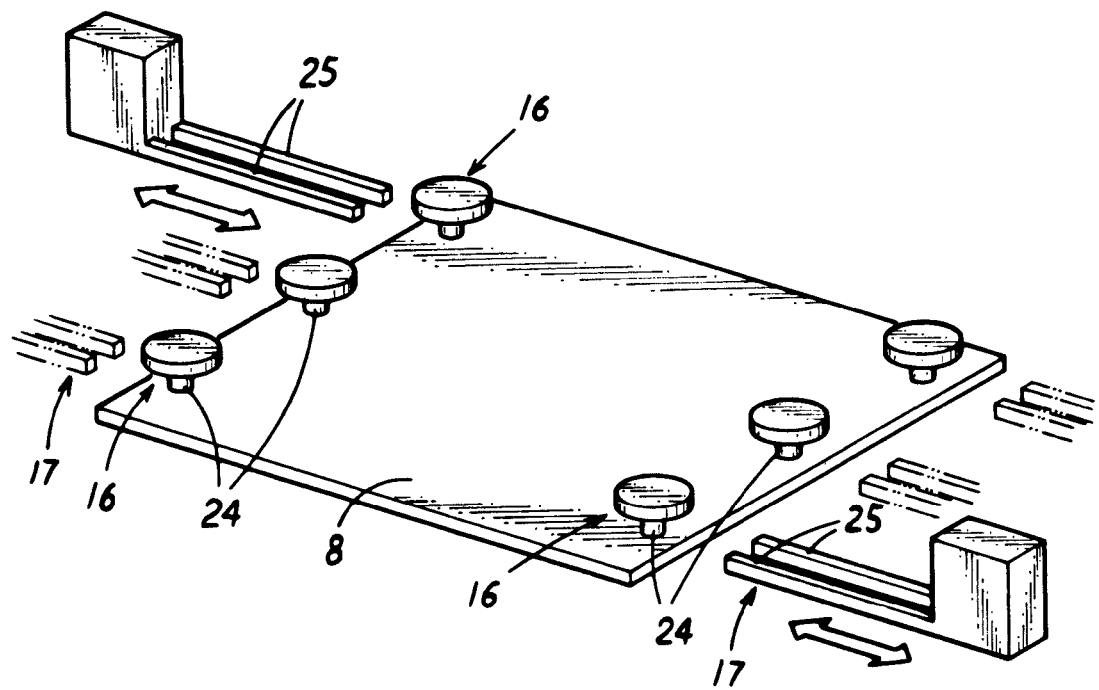
FIG. 10 is a schematic perspective view of the weight member transporting mechanism.
Figure 11:
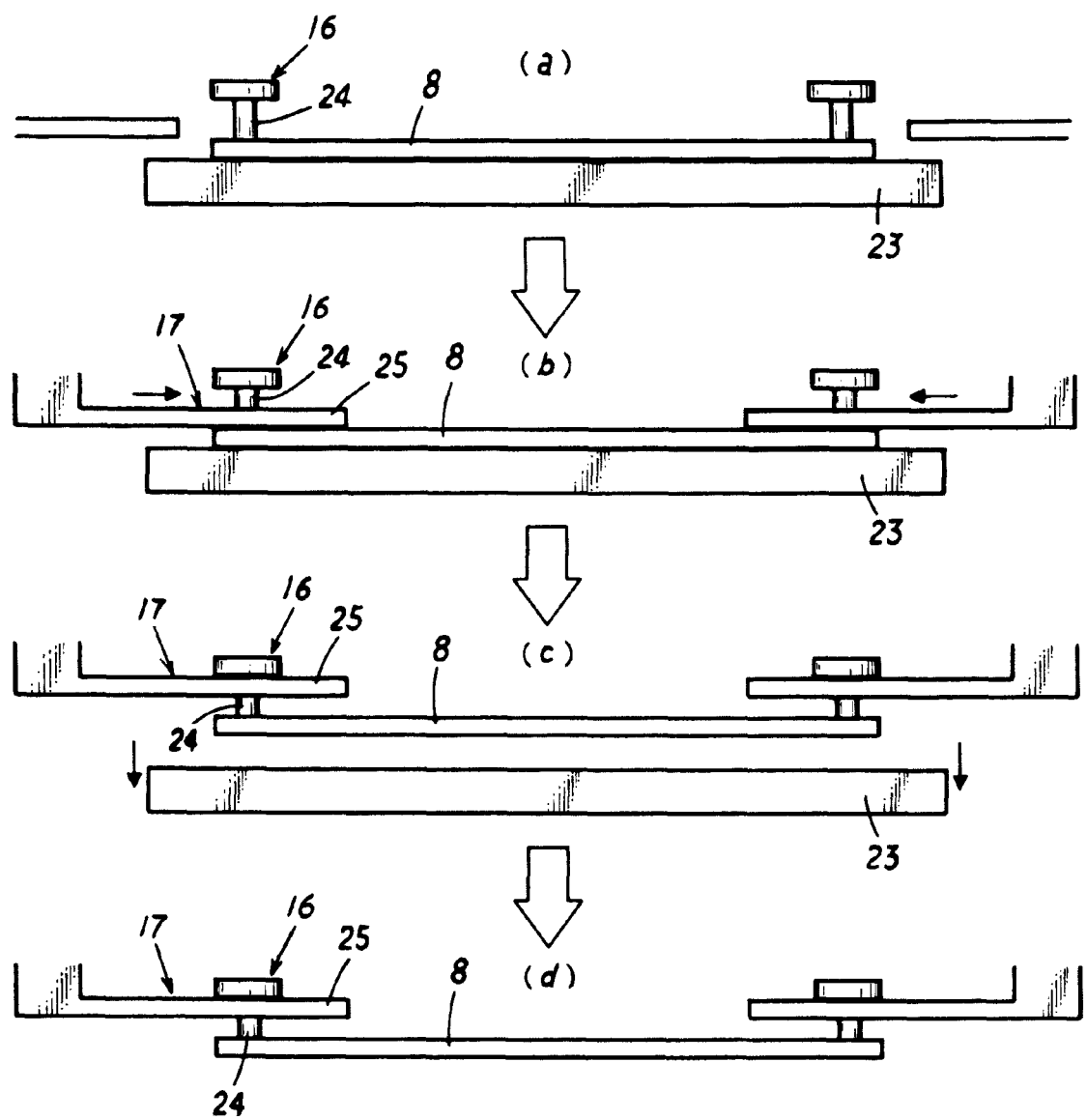
FIG. 11 is a schematic view for illustrating the usage sequence of the weight member transporting mechanism.

A plurality of knobs 24 having a large-diameter interlocking end part as an interlocking part 16 is provided in a protruding fashion on the upper surface of the weight member 8, as shown in FIG. 10, and when a plurality of interlocking bodies 17 (a transport hand in which a pair of interlocking pawls 25 is provided to the base at an interval that does not allow the large-diameter interlocking end part of the knobs 24 to be inserted, but does allow the small-diameter trunk part to be inserted) capable of interlocking with the interlocking end parts is provided, the weight member 8, as shown in FIG. 11, is transported from another chamber into the film-forming chamber using the robot hand 23 (FIG. 11(a)), the interlocking pawls 25 of the interlocking bodies are inserted between the interlocking end parts and the upper surface of the weight member 8 so as to cause the trunk part of the knobs 24 to be inserted between the interlocking pawls 25 (FIG. 11(b)), the robot hand 23 is lowered and the interlocking end parts and the interlocking pawls 25 are made to interlock (FIG. 11(c)), and the interlocking bodies 17 are moved to transport the weight member 8 (FIG. 11(d)).

A rubber magnet is used as the magnetic body 14, and preferably so, in that the film-forming mask 5, the substrate 6, the weight member 8, and the magnetic body 14 bend and adhere to each other in an advantageous manner.

Four notched grooves that correspond to the pressing part 15a to allow recess for the pressing part 15a are provided to the weight member 8 and the magnetic body 14. In the case the pressing part 15a is thin and does not form an obstacle, the configuration is not required to have notched grooves in the magnetic body 14.

The substrate 6 is not limited to being a glass substrate 6; it is also possible to advantageously form a film in a similar fashion when the substrate is made of a plastic, metal (foil) or other material.

The method for forming a film on the substrate is next described with reference to the present example.

Figure 12:
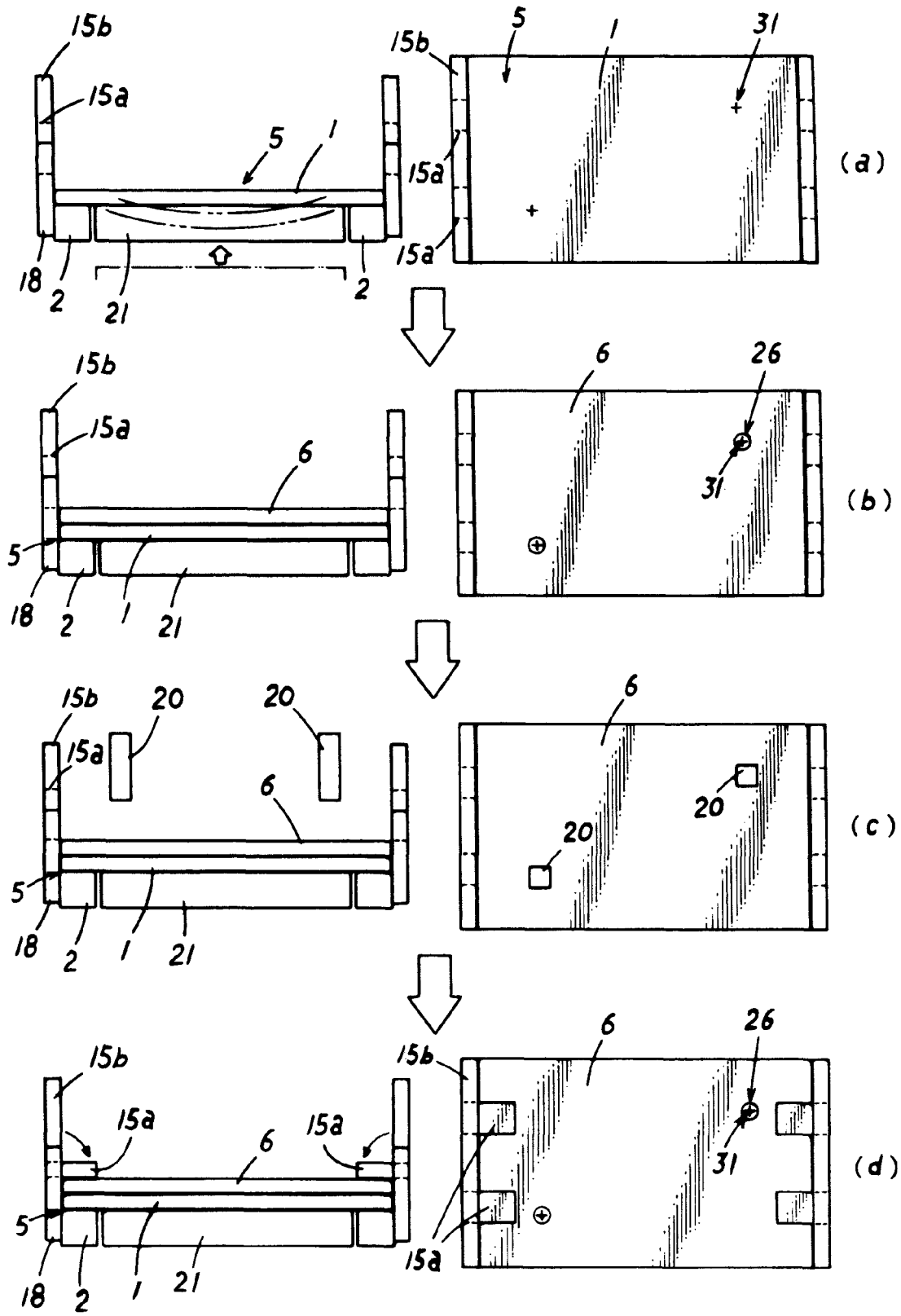
FIG. 12 is a schematic view for illustrating the film-forming sequence according to the present example.

The film-forming mask 5 is placed in the mask holder (not shown in FIGS. 12 to 14) inside the film-forming chamber, the support bodies 21 of the support mechanism are advanced upward from the retracted state, and the other pair of side parts 12 of the mask body 1 of the film-forming mask 5 is supported by the support bodies (FIG. 12(a)). The reference numeral 31 in the diagram is an alignment mark provided to the upper surface of the mask body 1.

Next, the substrate 6 is layered on the film-forming mask in a state in which the other pair of side parts 12 is supported by the support bodies 21 (FIG. 12(b)), whereupon the film-forming mask 5 and substrate 6 are aligned in an optimal superimposed position by the aligning mechanism while the alignment mark 31 is viewed with a camera 20 through a window 26 in the substrate 6 (FIG. 12(c)).

After the film-forming mask 5 and the substrate 6 have been aligned, the film-forming mask 5 and the substrate 6 supported in the mask holder are superimposed and secured by the first superimposing and securing mechanism. Specifically, the pressing part 15a of the first superimposing and securing mechanism is turned down, the lower surface end part of the holding parts 4 of the holding frame 2 of the film-forming mask 5 and the upper surface end part of the substrate 6 are held in place and the two are secured by the support surface part of the support body 13 and (the distal end part of) the pressing part 15a (FIG. 12(d)).

The weight member 8 is then layered on the substrate 6 (FIG. 13(a)), and the magnetic body 14 is subsequently layered on the weight member 8 (FIG. 13(b). Notches 27, 28 are provided to the two end parts of the weight member 8 and the magnetic body 14 so as to avoid the pressing part 15a of the first superimposing and securing mechanism for superimposing and securing the film-forming mask 5 and the substrate 6.

Figure 13:
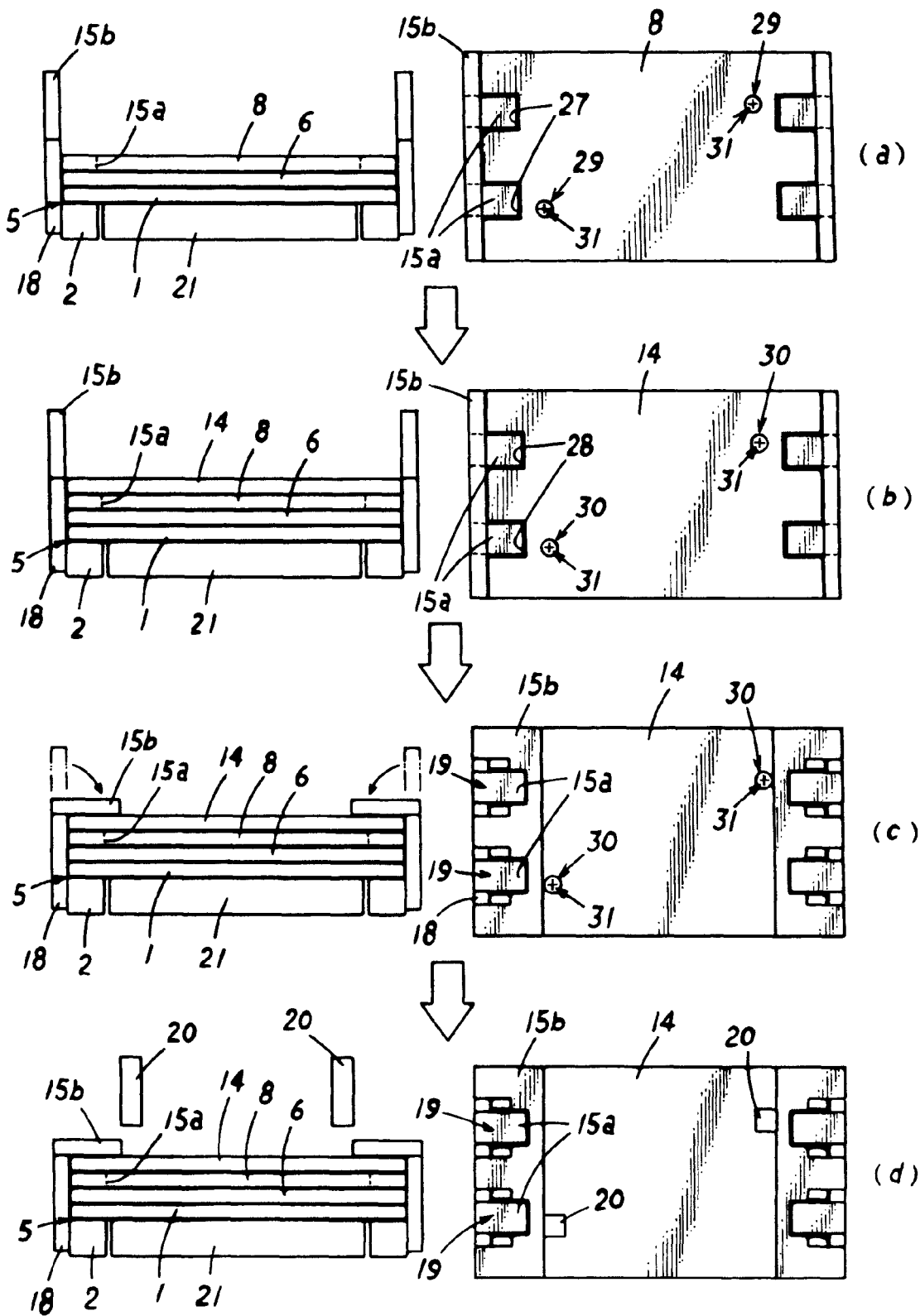
FIG. 13 is a schematic view for illustrating the film-forming sequence according to the present example.

Next, the film-forming mask 5 and substrate 6, and the weight member 8 and magnetic body 14 are superimposed and secured by the second superimposing and securing mechanism. Specifically, the pressing part 15b of the second superimposing and securing mechanism is turned down, the lower surface end part of the holding parts 4 of the holding frame 2 of the film-forming mask 5 and the upper surface end part of the magnetic body 14 are held in place by the support surface part of the support body 13 and (the distal end part of)

the pressing part 15*a*, and the film-forming mask 5 and substrate 6, and the weight member 8 and magnetic body 14 (FIG. 13(*c*)) are secured.

The film-forming mask 5 and substrate 6 are confirmed to be in an optimum superimposed position while the alignment mark 31 is viewed with a camera 20 through a window 26 in the substrate 6, and positioning is suitably carried out using the aligning mechanism when position correction is required (FIG. 13(*d*)). It is possible that the positions of the film-forming mask 5 and the substrate 6 will be brought out of alignment, albeit slightly, when the film-forming mask 5 and substrate 6 are further affixably superimposed by the weight member 8 and/or the magnetic body 14, and the above step is carried out as a precaution in order to confirm that this has not occurred. Windows 29, 30 are provided to locations aligned directly above the alignment mark 31 of the magnetic body 14 and the weight member 8 so that alignment is not affected.

Figure 14:
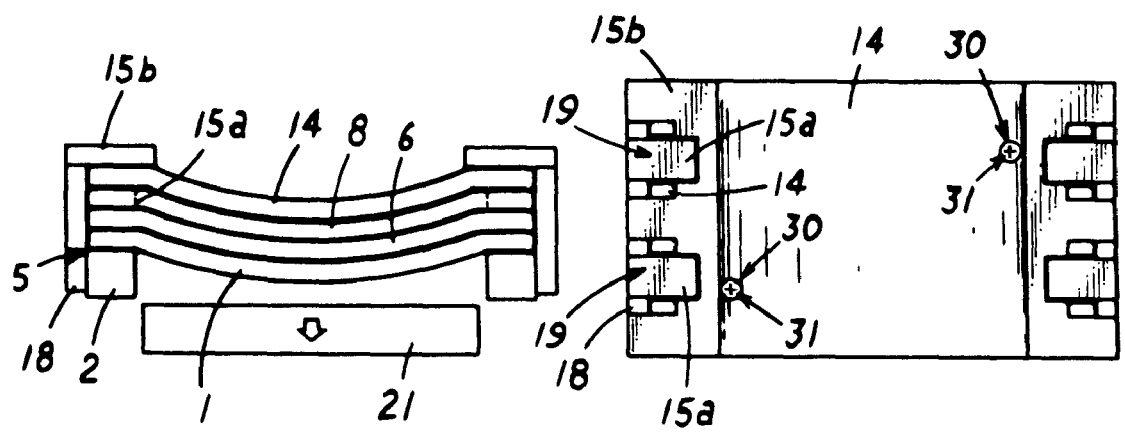
FIG. 14 is a schematic view for illustrating the film-forming sequence according to the present example.

The support bodies 21 are then retracted and the mask body 1 is allowed to bend in a natural manner (FIG. 14). In this state, film-forming material is sprayed by suitable film-forming means, whereby a thin film can be formed on the substrate 6 (the substrate surface) in a pattern that corresponds to the mask opening.

Since the present example is configured as described above, the film-forming mask 5, the substrate 6, and the weight member 8 and the magnetic body 14 are not superimposed and secured together; rather, there are separately provided a first superimposing and securing mechanism for superimposing and securing the film-forming mask 5 and the substrate 6, which require precise positioning by an aligning mechanism; and a second superimposing and securing mechanism for superimposing and securing, to the substrate 6, the magnetic body 14 and the weight member 8 to be superimposed on the substrate 6 with the film-forming mask 5 is superimposed and secured. It is thereby possible to superimpose and secure the film-forming mask 5 and the substrate 6 in advance when the weight member 8 and the magnetic body 14 are superimposed on the substrate 6, and the film-forming mask 5 and the substrate 6 can be reliably prevented from coming out of alignment from an optimal superimposing position even if the weight member 8 or the like makes contact with the substrate 6.

Therefore, the use of the film-forming mask 5 described above allows adhesion between the film-forming mask 5 and substrate 6 to be further improved without reducing the precision of the film-forming pattern or compromising processability, and a precise film-forming pattern can be readily formed without the film-forming mask 5 and substrate 6 becoming offset in position when the weight member 8 and/or the magnetic body 14 are superimposed on the substrate 6.

Therefore, the present example is very practical in that the substrate, the weight member and/or the magnetic body can be advantageously superimposed and secured while a superimposed state of the precisely aligned substrate and mask can be reliably maintained.

The present invention is not limited to the present example; the specific configuration can be suitably designed in accordance with various structural requirements.

The invention claimed is:

1. A film-forming device provided with a film-forming mask and film-forming means for depositing a film-forming material through said film-forming mask onto the surface of a substrate on which the film-forming mask has been superimposed, to form a thin film in a desired pattern, said film forming device comprising:

an aligning mechanism for moving said film-forming mask and said substrate relative to one another so that the film-forming mask and the substrate are aligned;

a first superimposing and securing mechanism for superimposing and securing said substrate and said film-forming mask aligned by the aligning mechanism; and a second superimposing and securing mechanism for superimposing and securing said substrate superimposed and secured to said film-forming mask by the first superimposing and securing mechanism, and a magnetic body for magnetically attracting to an obverse surface side of said substrate said film-forming mask or a weight member in the form of a sheet for causing said substrate to bend and causing said substrate to be affixably superimposed on said film-forming mask so that said film-forming mask is affixably superimposed on said substrate, the weight member being disposed on a reverse surface of the substrate, wherein said film-forming mask includes a mask body having a pattern of openings through which a film-forming material is allowed to pass, and a holding frame for holding the mask body;

said holding frame is provided with a pair of holding parts for holding a pair of side parts, respectively, among four sides of said mask body, the pair of holding parts being arranged along the pair of side parts, respectively; said holding frame being configured so that the mask body is held only by the pair of holding parts;

the pair of side parts is secured to said pair of holding parts so that said mask body bends under the weight thereof between the pair of side parts held by said pair of holding parts, and the amount by which said mask body bends varies in a direction a in which the pair of side parts oppose one another; and said first superimposing and securing mechanism or said second superimposing and securing mechanism is provided with a support body having a support surface part for supporting the substrate on which said film-forming mask has been superimposed; and configured to pressing parts rise and lower in relation to the support surface part of the support body; said first superimposing and securing mechanism or said second superimposing configured so that said film-forming mask and said substrate, or said substrate and said weight member or said magnetic body, are held by the pressing parts and the support surface part of the support body, whereby said film-forming mask and said substrate are superimposed and secured, or said substrate and said weight member or said magnetic body are superimposed and secured.

2. The film-forming device according to claim 1, characterized in comprising a support mechanism for supporting another pair of side parts, which belong to the mask body of said film-forming mask and are not held by the holding parts of said holding frame, so as to keep the side parts substantially horizontally when said film-forming mask and said substrate are aligned together.

3. The film-forming device according to claim 2, characterized in comprising:

a weight member transporting mechanism for holding and transporting said weight member in a substantially horizontal state, the weight member transporting mechanism having an electrostatic chucking mechanism capable of chucking said weight member, or having an interlocking body capable of interlocking with an interlocking part provided to the weight member.

4. The film-forming device according to claim 1, characterized in comprising:

a weight member transporting mechanism for holding and transporting said weight member in a substantially horizontal state, the weight member transporting mechanism having an electrostatic chucking mechanism capable of chucking said weight member, or having an interlocking body capable of interlocking with an interlocking part provided to the weight member.

* * * * *

UNITED STATES PATENT AND TRADEMARK OFFICE
CERTIFICATE OF CORRECTION

PATENT NO.        : 8,359,999 B2                              Page 1 of 1
APPLICATION NO.   : 12/863136
DATED             : January 29, 2013
INVENTOR(S)       : Yoshinari Kondo et al.

It is certified that error appears in the above-identified patent and that said Letters Patent is hereby corrected as shown below:

On the Title Page, item 57 Abstract, Line 15: insert --6-- after "substrate"

In the Specification

Column 2, Line 26: insert --5-- after "mask"

Column 2, Line 38: insert --2-- after "frame"

Column 9, Line 4: insert --5-- after "mask"

Column 11, Line 67 (last line): insert --17-- after "bodies"

Signed and Sealed this
Thirteenth Day of May, 2014

Michelle K. Lee
*Deputy Director of the United States Patent and Trademark Office*